United States Patent
Kuo et al.

(10) Patent No.: US 12,270,856 B2
(45) Date of Patent: Apr. 8, 2025

(54) DETECTION CIRCUIT AND DETECTION METHOD

(71) Applicant: REALTEK SEMICONDUCTOR CORPORATION, Hsinchu (TW)

(72) Inventors: Chun-Yi Kuo, Hsinchu (TW); Hsiao Tzu Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 193 days.

(21) Appl. No.: 17/717,142

(22) Filed: Apr. 11, 2022

(65) Prior Publication Data

US 2023/0126504 A1    Apr. 27, 2023

(30) Foreign Application Priority Data

Oct. 22, 2021    (TW) .................................. 110139318

(51) Int. Cl.
*G01R 31/317* (2006.01)
*H03K 3/037* (2006.01)
*H03K 5/24* (2006.01)
*H03K 5/00* (2006.01)

(52) U.S. Cl.
CPC .  *G01R 31/31725* (2013.01); *G01R 31/31727* (2013.01); *H03K 3/037* (2013.01); *H03K 5/24* (2013.01); *H03K 2005/00019* (2013.01)

(58) Field of Classification Search
CPC ........ G01R 31/31725; G01R 31/31727; G01R 31/31726; H03K 3/037; H03K 3/0375; H03K 5/24; H03K 2005/00019; H03K 2005/00058
See application file for complete search history.

(56) References Cited

U.S. PATENT DOCUMENTS

| | | | |
|---|---|---|---|
| 8,228,106 B2 * | 7/2012 | Baumann | H03K 5/135 327/278 |
| 9,841,776 B1 * | 12/2017 | Bari | G05F 1/56 |
| 10,686,433 B1 | 6/2020 | Kuo et al. | |
| 2010/0153895 A1 * | 6/2010 | Tetelbaum | G06F 30/3312 327/158 |
| 2013/0076398 A1 * | 3/2013 | Pechaud | H03K 5/26 327/31 |

(Continued)

*Primary Examiner* — Mark D Featherstone
*Assistant Examiner* — Rong Tang
(74) *Attorney, Agent, or Firm* — WPAT, P.C., INTELLECTUAL PROPERTY ATTORNEYS; Anthony King

(57) ABSTRACT

A detection circuit configured to detect whether timing violations occur in a target circuit. The target circuit is operated according a clock signal. The detection circuit includes a signal generation circuit, a first delay adjustable circuit, a second delay adjustable circuit, and a signal detector. The signal generation circuit is configured to generate a test signal. The first and second delay adjustable circuit are respectively configured to delay the test signal and clock signal to generate a first delay signal and a second delay signal according to the operating speed of the target circuit. The signal detector is configured to generate an indicating signal according to the first delay signal, the second delay signal, the test signal, and the clock signal. The indicating signal is configured to indicate whether an operating voltage of the target circuit causes a hold time violation of timing violations to occur in the target circuit.

19 Claims, 4 Drawing Sheets

(56) References Cited

U.S. PATENT DOCUMENTS

| | | | |
|---|---|---|---|
| 2014/0040692 A1* | 2/2014 | Shah .................... | G11C 29/021 714/E11.167 |
| 2015/0365081 A1* | 12/2015 | Lee ......................... | H04B 1/16 327/263 |
| 2020/0212900 A1* | 7/2020 | Kuo ....................... | H03K 5/135 |
| 2020/0226295 A1* | 7/2020 | Patel ................... | G06F 11/0772 |

* cited by examiner

DETECTION CIRCUIT AND DETECTION METHOD

CROSS-REFERENCE TO RELATED APPLICATIONS

This application claims the benefit of priority to Patent Application No. 110139318, filed in Taiwan on Oct. 22, 2021, which is incorporated by reference in its entirety.

TECHNICAL FIELD

The present application relates to a detection circuit and a detection method, particularly to a detection circuit and a detection method for addressing timing violations.

BACKGROUND

An operation speed of an integrated circuit is determined by the degree of delay in signal transmission caused by a critical path in the circuit. The critical path is affected by process, voltage, temperature and aging (PVTA), and other factors. When the transmission delay exceeds the design slack of the circuit, the circuit may experience setup time violation or hold time violation.

SUMMARY OF THE INVENTION

An aspect of the present disclosure provides a detection circuit configured to detect whether timing violations occur in a target circuit, wherein the target circuit is operated according to a clock signal. The detection circuit includes a signal generation circuit, a first delay adjustable circuit, a second delay adjustable circuit, and a signal detector. The signal generation circuit is configured to generate a test signal. The first delay adjustable circuit is configured to delay the test signal to generate a first delay signal according to an operating condition of the target circuit. The second delay adjustable circuit is configured to delay the clock signal to generate a second delay signal according to the operating condition. The signal detector is configured to generate an indicating signal according to the first delay signal, the second delay signal, the test signal and the clock signal. The indicating signal is configured to indicate whether an operating voltage of the target circuit causes a hold time violation of the timing violations to occur in the target circuit.

Another aspect of the present disclosure provides detection method configured to detect whether timing violations occurs in a target circuit, wherein the target circuit is operated according to a clock signal. The detection method includes the operations of: generating a test signal; delaying the test signal to generate a first delay signal according to an operating condition of the target circuit; delaying the clock signal to generate a second delay signal according to the operating condition; and generating an indicating signal according to the first delay signal, the second delay signal, the test signal and the clock signal, wherein the indicating signal is configured to indicate whether an operating voltage of the target circuit causes a hold time violation in the timing violations to occur in the target circuit.

The detection circuit and detection method of the present disclosure detect whether the hold time of the target circuit can be compatible with the operation of the clock signal to avoid an occurrence of hold time violation.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
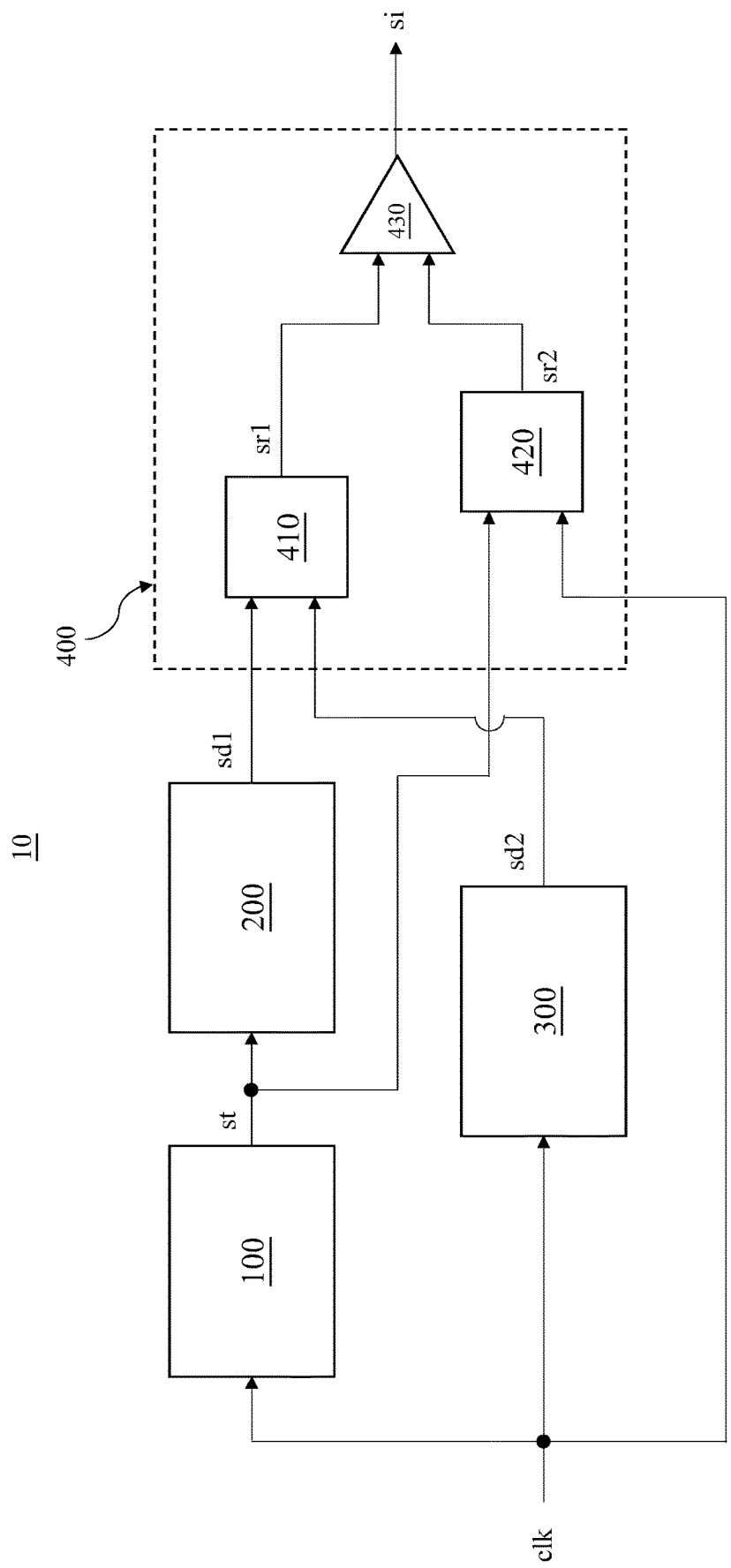
FIG. 1 is a schematic diagram illustrating a detection circuit according to certain embodiments of the present disclosure.

FIG. 1 is a schematic diagram illustrating embodiments of the detection circuit 10 according to the present disclosure. The detection circuit 10 is configured to detect whether the timing violations will occur in a target circuit (not shown in the drawings) when the target circuit is operated, wherein the target circuit is operated according to a clock signal clk. The detection circuit 10 and the target circuit are arranged in the same integrated circuit; however, the present disclosure is not limited thereto.

The result of the operation of the target circuit is affected by an operating condition, wherein the operating condition includes the process, the current operating voltage, the current temperature and the current aging degree of the target circuit, or the combinations thereof. The delays of the signal in the target circuit can be various in different operating conditions. When the delay of the signal in the target circuit exceeds the design slack (can be understood as a predetermined degree of tolerance) of the target circuit, timing violations may occur in the target circuit. More specifically, when the delay of the signal is too bad, the setup time and the hold time of the target circuit may be seriously shifted so that the setup time and the hold time fail to match the normal operation of the clock signal, resulting in a setup time violation or a hold time violation. To avoid timing violations, the detection circuit 10 detects whether the timing violations occur according to the operating conditions of the target circuit. In some embodiments, the detection circuit 10 is configured to detect whether the hold time violation occurs.

In some embodiments, the target circuit has a critical path, where the critical path is the path with the least delay or the largest timing skew among the signal paths between any two consecutive levels of flip-flops in the target circuit, i.e., the critical path is where the target circuit is most likely to have hold time violations. The detection circuit 10 and the target circuit are arranged in the same chip and have substantially identical variation factors such as process drift, voltage, and ambient temperature, so it can be used to simulate the delay caused by the critical path to detect whether the timing violations occur in the target circuit.

The detection circuit 10 is operated according to the clock signal clk, and the detection circuit 10 may include a signal generation circuit 100, a delay adjustable circuit 200, a delay adjustable circuit 300, and a signal detector 400. The signal generation circuit 100 is configured to generate a test signal st, wherein the test signal st is delayed by the delay adjustable circuit 200 to be a delay signal sd1 and transmitted to the signal detector 400. The clock signal clk is delayed by the delay adjustable circuit 300 to be a delay signal sd2 and transmitted to the signal detector 400. In other words, the delay signal sd1 and the delay signal sd2 are the delayed test signal st and the delayed clock signal clk, respectively.

In some embodiments, the test signal st is a rising signal, such as a digital signal represented by the digital sequence "01;" however, the present disclosure is not limited thereto. The test signal st may be a falling signal, such as a digital signal represented by the digital sequence "10."

The delay adjustable circuit 200 and the delay adjustable circuit 300 delay the test signal st and the clock signal clk, respectively, according to the operating conditions of the target circuit. Generally speaking, the delay of the signal is related to the wiring length of the transmission path. However, as the process and circuit speeds advance, the setup time violation and hold time violation of the circuit also take the signal transient rate (also known as slew rate) and the timing skew of the clock to each flip-flop into account. For example, when the operating voltage of the target circuit is increased, the transient rate of the signal grows, which shortens the time for the signal to reach a predetermined voltage value (e.g., the time from 0 to 1 becomes shorter). Conversely, when the operating voltage decreases, the transient rate of the signal reduces, and the time for the signal to reach the preset voltage value extends (e.g., the time from 0 to 1 is lengthened). The delay adjustable circuit 200 and the delay adjustable circuit 300 are configured to adjust the transient rate and timing skew of the test signal st and the clock signal clk, respectively.

As mentioned above, since the detection circuit 10 is configured to simulate the critical path in the target circuit, the delay adjustable circuit 200 and the delay adjustable circuit 300 adjust the timing skew and transient rate of the test signal st and the clock signal clk, respectively, according to the load and the wiring length of the critical path.

Figure 4:
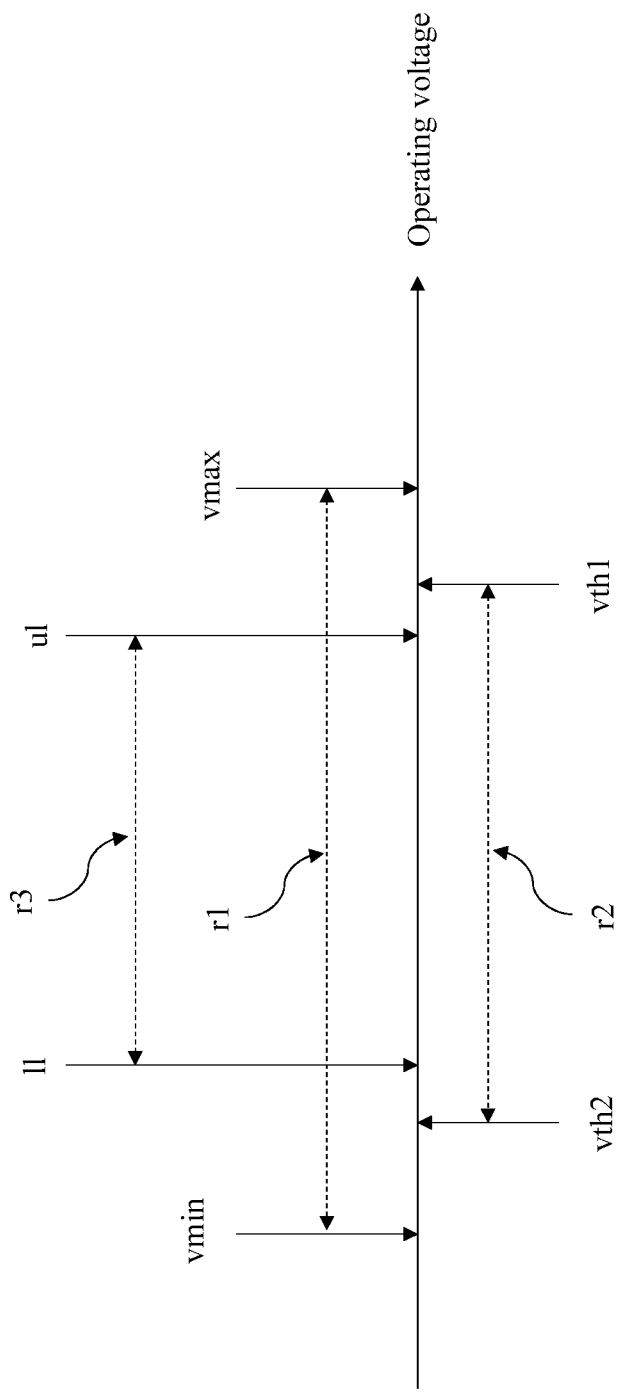
FIG. 4 is a schematic diagram illustrating a range of an operating voltage according to certain embodiments of the present disclosure.

In general, the transient rate of the signal is also related to the operating voltage of the circuit in addition to the load of the transmission path; in some embodiments, the operating voltage is positively correlated with the transient rate of the signal. Thus, the delay adjustable circuit 200 and the delay adjustable circuit 300 can adjust the transient rate of the test signal st and the clock signal clk, respectively, according to the operating voltage of the target circuit. In certain embodiments, when the operating voltage of the target circuit is considerably high, the hold time of the data signal is not long enough, thereby causing a hold time violation. The detection circuit 10 is configured to obtain the maximum value of the operating voltage (first threshold value vth1 as shown in FIG. 4) in the case where the target circuit does not experience a hold time violation. In some other embodiments, when the operating voltage of the target circuit is considerably low, the transient rate of the clock signal is too low that it takes a long time to reach the predetermined voltage level, thereby causing a hold time violation. The detection circuit 10 is configured to obtain the minimum value of the operating voltage (second threshold value vth2 as shown in FIG. 4) in the case where the target circuit does not experience a hold time violation. It is noted that the setup time violation is not within the scope of this application.

The signal detector 400 includes a response unit 410, a response unit 420, and a comparator 430. In some embodiments, the response unit 410 and the response unit 420 are flip-flops, such as D-type flip-flops. For ease of understanding, the following response unit 410 and response unit 420 are explained in terms of D-type flip-flops. The comparator 430 can be implemented by way of logic gates of integrated circuit.

The response unit 410 is configured to receive the delay signal sd1 and generate a response signal sr1 from the delay signal sd1 when a rising edge of the delay signal sd2 (the delayed clock signal clk) reaches the response unit 410. The response unit 420 is configured to receive the test signal st and generate a response signal sr2 from the test signal st when a rising edge of clock signal clk reaches the response unit 420. When the test signal st has a digital sequence "01," the response unit 420 generates the response signal sr2 having the digital sequence "01" according to the clock signal clk. Similarly, the response unit 410 receives the delay signal sd1 (the delayed test signal st, which still has a digital sequence "01") and generates the response signal sr1 having the digital sequence "01" according to the delay signal sd2.

When the hold time of the delay signal sd1 in the reaction unit 410 can match with the delay signal sd2 so as to make the reaction unit 410 operate normally, the reaction unit 410 generates the response signal sr1 having the same digital sequence as the response signal sr2 (i.e., the response signal sr1 has a digital sequence "01") according to the delay signal sd2. Therefore, when there is no hold time violation, the response signal sr1 is identical to the response signal sr2, and the comparator 430 receives the response signal sr1 and the response signal sr2 to generate an indication signal si having a first level, wherein the indication signal si with the first level is configured to indicate that no hold time violation has occurred.

A hold time violation occurs when the hold time of the delay signal sd1 in the response unit 410 fails to match the delay signal sd2 so as to make the response unit 410 operate improperly. When the response unit 410 receives the rising edge of the delay signal sd2, the response signal sr1 generated by the response unit 410 is different from the response signal sr2 because the delay signal sd1 received by the response unit 410 is no longer held at the correct voltage level. The comparator 430 receives the response signal sr1 and the response signal sr2 to generate the indication signal si with a second level, wherein the indication signal si with the second level is configured to indicate the occurrence of a hold time violation.

Figure 2:
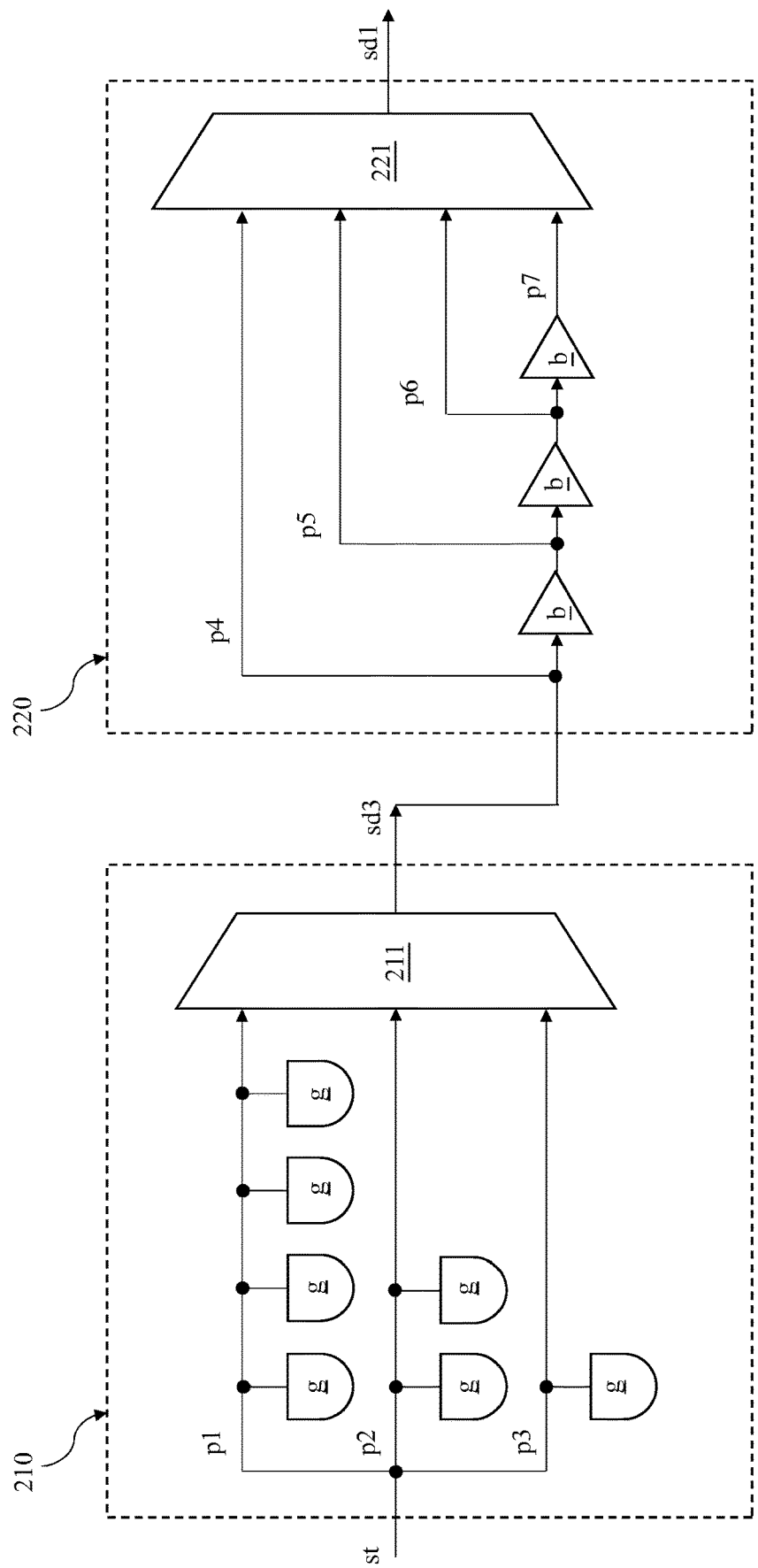
FIG. 2 is a schematic diagram illustrating a delay adjustable circuit according to certain embodiments of the present disclosure.

Reference is made to FIG. 2. FIG. 2 is a schematic diagram of some embodiments of the delay adjustable circuit 200. The delay adjustable circuit 200 includes a transient rate adjustable circuit 210 and a timing adjustable circuit 220, which are coupled in series. In FIG. 2, the timing adjustable circuit 220 is connected in series after the transient rate adjustable circuit 210, but the present disclosure is not limited thereto. In other embodiments, the transient rate adjustable circuit 210 is coupled in series after the timing adjustable circuit 220.

The transient rate adjustable circuit 210 includes a multiplexer 211, a path p1, a path p2, and a path p3. The multiplexer 211 is configured to receive the test signal st via one of the path p1, path p2, and path p3. When the transient rate adjustable circuit 210 receives the test signal st, the path p1, path p2, and path p3 each delay the test signal st according to its own load. The multiplexer 211 is configured to select the test signal st transmitted by path p1, path p2, or path p3 to output to be a delay signal sd3 and transmitted the same to the timing adjustable circuit 220.

The path p1, path p2 and path p3 include different numbers of floating gates g. As shown in FIG. 2, the path p1, path p2 and path p3 includes 4, 2 and 1 floating gates g, respectively. When the number of floating gates g increases, the load on the path p1, path p2 and path p3 increases. Therefore, after the test signal st passes through the path p1, path p2 and path p3, the test signal st is adjusted to have different transient rates due to the different loads.

The timing adjustable circuit 220 includes a multiplexer 221, a path p4, a path p5, a path p6, and a path p7. The multiplexer 221 is configured to receive the delay signal sd3 through one of the path p4, path p5, path p6, and path p7. When the delay signal sd3 is received by the timing adjustable circuit 220, the path p4, path p5, path p6, and path p7 further delay the delay signal sd3, respectively. The multiplexer 221 is configured to select the delay signal sd3 transmitted by path p4, path p5, path p6 or path p7 to output to be the delay signal sd1 and transmitted the same to the signal detector 400.

The path p4, path p5, path p6 and path p7 include different numbers of buffers b. As shown in FIG. 2, the path p4, path p5, path p6 and path p7 includes 0, 1, 2 and 3 buffers b, respectively. When the number of buffers b increases, it means that the timing skew on the path p4, path p5, path p6 and path p7 increases. Therefore, when the delay signal sd3 passes through the path p4, path p5, path p6 and path p7, the delay signal s3 is adjusted to have different timing skews because of the different number of buffer b.

The number of paths included in the transient rate adjustable circuit 210 and the timing adjustable circuit 220 and the number of components (e.g., floating gates, buffers) on the paths are not limited to those shown in FIG. 2. Various numbers of paths are within the contemplated scope of the present disclosure.

Figure 3:
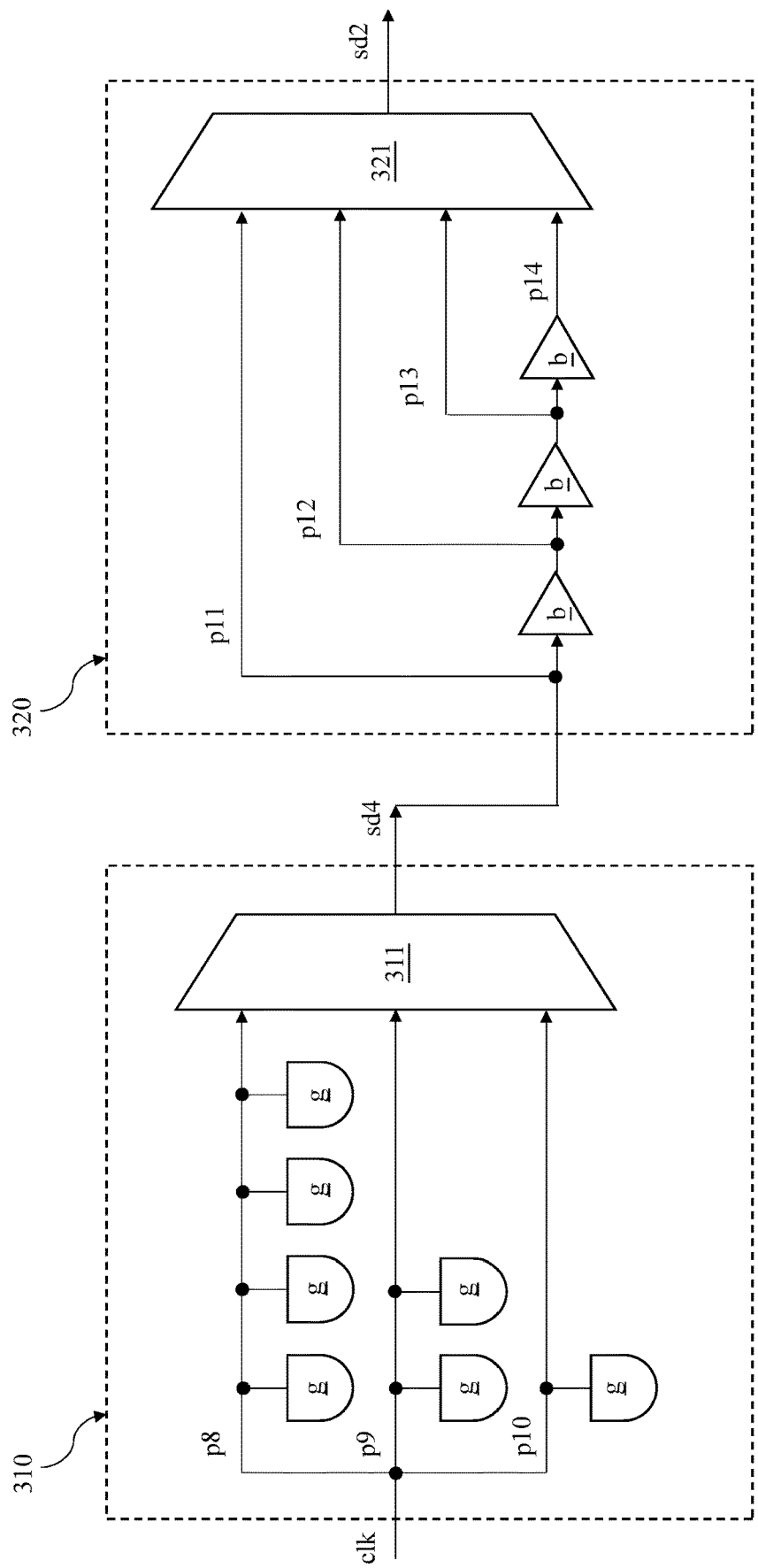
FIG. 3 is a schematic diagram illustrating a delay adjustable circuit according to certain embodiments of the present disclosure.

FIG. 3 is a schematic diagram of some embodiments of the delay adjustable circuit 300. The delay adjustable circuit 200 and the delay adjustable circuit 300 are similar, and the structure and operation of the delay adjustable circuit 300 will not be described for the sake of brevity.

Reference is made to FIG. 1, FIG. 2, FIG. 3 and FIG. 4 concurrently. The detection circuit 10 is configured to determine the first threshold value vth1 and the second threshold value vth2 of the operating voltage of the target circuit, wherein the first threshold value and the second threshold value represent the upper limit and the lower limit of the operating voltage of the target circuit, respectively.

The specification parameters of the target circuit includes the range of the operating voltage (having the maximum value vmax and the minimum value vmin); however, due to different processes, temperatures and aging levels, the circuit characteristics of the target circuit are changed so that the operating voltage range r1 specified in the specification exceeds the actual implementable operating voltage range r2 (the range defined by the first threshold value vth1 and the second threshold vth2 value). Therefore, the detection circuit is configured to detect the characteristics of the target circuit close to the maximum value vmax and the minimum value vmin of the operating voltage range r1 so as to determine the implementable operating voltage range r2 of the target circuit.

When the detection circuit 10 is used to determine the first threshold value vth1, the multiplexer 211 is used to select the test signal st transmitted by the path p3 to output to be the delay signal sd3, wherein the path p3 has the smallest load among paths p1-p3, and the load of the path p3 corresponds to the operating voltage vmax. Next, the multiplexer 321 selects the delay signal sd4 transmitted by the path p14 to be outputted as the delay signal sd2, wherein the timing skew caused by the path p14 to the delay signal sd4 corresponds to the timing skew caused by the critical path to the signal in the target circuit. More particularly, when the operating voltage vmax is applied to the target circuit, it produces a change in the transient rate on the critical path which is the same as the delay of the path p3 to the test signal st, and a timing skew thus generated is the same as the delay of the path p14 to the delay signal sd4. In the operating conditions simulating the operating voltage vmax and the critical path, the detection circuit 10 then uses at least one of the multiplexers 211, 221, 311, and 321 to adjust the delay level of the delay signal sd1 and/or the delay signal sd2 to determine the first threshold value vth1. In other words, when multiplexers 211, 221, 311 and 321 select different paths p1-p14 to generate different levels of delay, the selected combinations of paths p1-p14 correspond to different operating conditions of the target circuit (i.e., different operating voltages, temperatures and/or aging levels), and the different operating conditions correspond to different operating speeds of the target circuit.

Similarly, when the detection circuit 10 is used to determine the first threshold value vth2, the multiplexer 211 is used to select the test signal st transmitted by the path p1 to be outputted as the delay signal sd3 corresponding to the operating voltage vmin. In the operating conditions simulating the operating voltage vmin and the critical path, the detection circuit 10 then uses at least one of the multiplexers 211, 221, 311, and 321 to adjust the delay level of the delay signal sd1 and/or the delay signal sd2 to determine the second threshold value vth2.

When the operating voltage exceeds the implementable operating voltage range r2 shown in FIG. 4, the hold time violation occurs in the target circuit. In further embodiments, the detection circuit 10 is configured to avoid the hold time violation occurring in the target circuit, so that the detection circuit 10 generates the indication signal si to indicate that the hold time violation is going to occur before the actual hold time violation occurs. Specifically, to avoid an unstable situation where the operating voltage is equal to the first threshold value vth1 or the second threshold value vth2, the detection circuit 10 is configured to determine an operating voltage range r3, wherein the upper limit ul of the operating voltage range r3 is less than the first threshold value vth1 and the lower limit ll of the operating voltage range r3 is greater than the second threshold value vth2. When the operating voltage exceeds the operating voltage range r3, the detection circuit 10 generates the indication signal si to indicate that the hold time violation occurs.

The foregoing description briefly sets forth the features of certain embodiments of the present application so that persons having ordinary skill in the art more fully understand the various aspects of the disclosure of the present application. It will be apparent to those having ordinary skill in the art that they can easily use the disclosure of the present application as a basis for designing or modifying other processes and structures to achieve the same purposes and/or benefits as the embodiments herein. It should be understood by those having ordinary skill in the art that these equivalent implementations still fall within the spirit and scope of the disclosure of the present application and that they may be subject to various variations, substitutions, and alterations without departing from the spirit and scope of the present disclosure.

What is claimed is:
1. A detection circuit, configured to detect whether timing violations occur in a target circuit, wherein the target circuit is operated according to a clock signal, comprising:
 a signal generation circuit, configured to generate a test signal according to the clock signal;

a first delay adjustable circuit, configured to delay the test signal to generate a first delay signal according to an operating condition of the target circuit;

a second delay adjustable circuit, configured to delay the clock signal to generate a second delay signal according to the operating condition; and a signal detector, configured to receive the first delay signal, the second delay signal, the test signal and the clock signal so as to generate an indicating signal, wherein the indicating signal is configured to indicate whether an operating voltage of the target circuit causes a hold time violation of the timing violations to occur in the target circuit, wherein the signal detector comprises:

a first response unit, configured to receive the first delay signal and the second delay signal, and generate a first response signal from the first delay signal when a rising edge of the second delay signal reach the first response unit; and a second response unit, configured to receive the test signal and the clock signal, and generate a second response signal from the test signal when a rising edge of the clock signal reach the second response unit.

2. The detection circuit of claim 1, wherein the operating condition comprises at least one of a process of the target circuit, a current operating voltage of the target circuit, a current temperature of the target circuit, or the combinations thereof.

3. The detection circuit of claim 1, wherein the first response unit and the second response unit are flip-flops.

4. The detection circuit of claim 1, wherein the signal detector further comprises:

a comparator, configured to receive the first response signal and the second response signal so as to generate the indicating signal, wherein when the first response signal and the second response signal are different, the indicating signal is generated to have a first level to indicate that the operating voltage of the target circuit causes the hold time violation to occur in the target circuit, and when the first response signal and the second response signal are identical, the indicating signal is generated to have a second level to indicate that the operating voltage of the target circuit does not cause the hold time violation to occur in the target circuit, wherein the first level is different from the second level.

5. The detection circuit of claim 1, wherein the first delay adjustable circuit comprises:

a first transient rate adjustable circuit, configured to adjust a transient rate of the test signal according to the operating condition; and a first timing adjustable circuit, configured to adjust a timing skew of the test signal according to the operating condition.

6. The detection circuit of claim 5, wherein the first transient rate adjustable circuit comprises:

a first load path, configured to adjust the transient rate of the test signal according to a first load;

a second load path, configured to adjust the transient rate of the test signal according to a second load, wherein the first load is different from the second load; and a first multiplexer, configured to select the test signal transmitt transmitted by the first load path or the second load path, and transmit the same signal to the first timing adjustable circuit.

7. The detection circuit of claim 6, wherein the first load path comprises a first number of floating gates, and the second load path comprises a second number of floating gates, wherein the first number is different from the second number.

8. The detection circuit of claim 5, wherein the first timing adjustable circuit comprises:

a first skew path, configured to adjust the timing skew of the test signal according to a first skew;

a second skew path, configured to adjust the timing skew of the test signal according to a second skew; and a second multiplexer, configured to select the test signal transmitted by the first skew path or the second skew path, and transmit the same signal to the signal detector.

9. The detection circuit of claim 8, wherein the first skew path comprises a third number of buffers coupled in series, and the second skew path comprises a fourth number of buffers coupled in series, wherein the third number is different from the fourth number.

10. The detection circuit of claim 1, wherein the second delay adjustable circuit comprises:

a second transient rate adjustable circuit, configured to adjust a transient rate of the clock signal according to the operating condition; and a second timing adjustable circuit, configured to adjust a timing skew of the clock signal according to the operating condition.

11. The detection circuit of claim 10, wherein the second transient rate adjustable circuit comprises:

a third load path, configured to adjust the transient rate of the clock signal according to a third load;

a fourth load path, configured to adjust the transient rate of the clock signal according to a fourth load, wherein the third load is different from the fourth load; and a third multiplexer, configured to select the clock signal transmitted by the third load path or the fourth load path, and transmit the same signal to the second timing adjustable circuit.

12. The detection circuit of claim 10, wherein the second timing adjustable circuit comprises:

a third skew path, configured to adjust the timing skew of the clock signal according to a third skew;

a fourth skew path, configured to adjust the timing skew of the clock signal according to a fourth skew; and a fourth multiplexer, configured to select the clock signal transmitted by the third skew path or the fourth skew path and transmit the same signal to the signal detector.

13. A detection method, configured to detect whether timing violations occurs in a target circuit, wherein the target circuit is operated according to a clock signal, comprising:

generating a test signal according to the clock signal;

delaying the test signal to generate a first delay signal according to an operating condition of the target circuit;

delaying the clock signal to generate a second delay signal according to the operating condition; and receiving the first delay signal, the second delay signal, the test signal and the clock signal so as to generate an indicating signal, wherein the indicating signal is configured to indicate whether an operating voltage of the target circuit causes a hold time violation in the timing violations to occur in the target circuit, comprising:

generating a first response signal from the first delay signal when the first delay signal and a rising edge of the second delay signal are received at the same time; and generating a second response signal from the test signal when the test signal and a rising edge of the clock signal are received at the same time.

14. The detection method of claim 13, wherein the operating condition comprises at least one of a process of the target circuit, a current operating voltage of the target circuit, a current temperature of the target circuit, or the combinations thereof.

15. The detection method of claim 13, wherein the step of generating the indicating signal according to the first delay signal and the clock signal further comprises:

comparing the first response signal and the second response signal to generate the indicating signal, wherein when the first response signal and the second response signal are different, the indicating signal is configured to indicate that the operating voltage of the target circuit causes the hold time violation to occur in the target circuit, and when the first response signal and the second response signal are identical, the indicating signal is configured to indicate that the operating voltage of the target circuit does not cause the hold time violation to occur in the target circuit.

16. The detection method of claim 13, wherein the step of delaying the test signal to generate the first delay signal according to the operating condition of the target circuit comprises:

adjusting a transient rate of the test signal according to the operating condition; and adjusting a timing skew of the test signal according to the operating condition, wherein the step of delaying the clock signal to generate the second delay signal according to the operating condition comprises:

adjusting a transient rate of the clock signal according to the operating condition; and adjusting a timing skew of the clock signal according to the operating condition.

17. The detection method of claim 13, further comprising:

determining a first threshold value according to the indicating signal, wherein the first threshold value represents an upper limit of the operating voltage of the target circuit, wherein the first threshold value is less than a maximum value of the operating voltage, wherein the step of generating the indicating signal according to the first delay signal, the second delay signal, the test signal and the clock signal comprises:

adjusting the operating condition to adjust the first delay signal and the second delay signal according to the maximum value of the operating voltage of the target circuit; and generating the indicating signal according to the adjusted first delay signal, the adjusted second delay signal, the test signal and the clock signal.

18. The detection method of claim 17, further comprising:

determining a second threshold value according to the indicating signal, wherein the second threshold value represents a lower limit of the operating voltage of the target circuit, wherein the second threshold value is greater than a minimum value of the operating voltage, wherein the step of generating the indicating signal according to the first delay signal, the second delay signal, the test signal and the clock signal further comprises:

adjusting the operating condition to adjust the first delay signal and the second delay signal according to the maximum value of the operating voltage of the target circuit; and generating the indicating signal according to the adjusted first delay signal, the adjusted second delay signal, the test signal and the clock signal.

19. The detection method of claim 18, wherein when the operating voltage of the target circuit exceeds a range defined by the first threshold value and the second threshold value, the indicating signal is further configured to indicate an occurrence of the hold time violation.

* * * * *